US012635312B2

(12) United States Patent
Blakely et al.

(10) Patent No.: US 12,635,312 B2
(45) Date of Patent: May 19, 2026

(54) COVER STRUCTURE ARRANGEMENTS FOR LIGHT EMITTING DIODE PACKAGES

(71) Applicant: CreeLED, Inc., Durham, NC (US)

(72) Inventors: Colin Blakely, Raleigh, NC (US); Eric Kamp, Durham, NC (US); Derek Miller, Columbus, OH (US)

(73) Assignee: CreeLED, Inc., Durham, NC (US)

( * ) Notice: Subject to any disclaimer, the term of this patent is extended or adjusted under 35 U.S.C. 154(b) by 662 days.

(21) Appl. No.: 18/057,805

(22) Filed: Nov. 22, 2022

(65) Prior Publication Data

US 2023/0080947 A1     Mar. 16, 2023

Related U.S. Application Data

(63) Continuation-in-part of application No. 17/103,121, filed on Nov. 24, 2020, now abandoned.

(51) Int. Cl.
H10H 20/85          (2025.01)
H10H 20/851         (2025.01)
(Continued)

(52) U.S. Cl.
CPC ...... H10H 20/8506 (2025.01); H10H 20/851 (2025.01); H10H 20/855 (2025.01); H10H 20/856 (2025.01)

(58) Field of Classification Search
CPC combination set(s) only.
See application file for complete search history.

(56) References Cited

U.S. PATENT DOCUMENTS 6,744,077 B2 * 6/2004 Trottier ................ H10H 20/851
                                                        257/89
7,087,936 B2     8/2006 Negley
                    (Continued)

FOREIGN PATENT DOCUMENTS

EP          2989665 B1     9/2020

OTHER PUBLICATIONS

Invitation to Pay Additional Fees and Partial Search for International Patent Application No. PCT/US2021/055547, mailed Feb. 10, 2022, 12 pages.

(Continued)

*Primary Examiner* — Mark W Tornow
*Assistant Examiner* — Priya M Rampersaud
(74) *Attorney, Agent, or Firm* — Withrow & Terranova, P.L.L.C.

(57)          ABSTRACT

Solid-state lighting devices including light-emitting diodes (LEDs) and more particularly cover structure arrangements for packaged LED devices are disclosed. Cover structures include light-absorbing layers configured to absorb certain wavelengths of light while permitting other wavelengths to pass therethrough. Light-absorbing layers may include pigment materials of colors that absorb intended wavelengths of light. In certain aspects, an LED package may include an LED chip configured to emit light of a first peak wavelength and a cover structure that includes a light-absorbing layer with a pigment of a color that absorbs the first peak wavelength. Such an arrangement may be useful for embodiments that also include a lumiphoric material that converts a portion of the first peak wavelength to light of a second peak wavelength. Cover structures may include one or more combinations of light-absorbing layers, antireflective layers, and reflective layers for providing improved emission characteristics for the LED package.

10 Claims, 11 Drawing Sheets

(51) Int. Cl.
 *H10H 20/855*  (2025.01)
 *H10H 20/856*  (2025.01)

(56)   References Cited

U.S. PATENT DOCUMENTS

| | | | |
|---|---|---|---|
| 7,914,192 | B2 | 3/2011 | Coleman |
| 8,408,775 | B1 | 4/2013 | Coleman |
| 8,637,883 | B2 | 1/2014 | Chakraborty |
| 8,916,890 | B2 | 12/2014 | Chakraborty |
| 9,587,790 | B2 | 3/2017 | Pickard et al. |
| 10,290,777 | B2 | 5/2019 | Andrews et al. |
| 10,388,838 | B2 | 8/2019 | Hung et al. |
| 10,879,434 | B2 | 12/2020 | Chen |
| 11,101,410 | B2 | 8/2021 | Hussell |
| 2004/0217370 | A1 | 11/2004 | Negley |
| 2006/0097245 | A1 | 5/2006 | Aanegola et al. |
| 2013/0001605 | A1 | 1/2013 | Ishihara et al. |
| 2014/0009834 | A1 | 1/2014 | Kalyankar |
| 2014/0110736 | A1 | 4/2014 | Waragaya |
| 2014/0146547 | A1 | 5/2014 | Tsutsumi et al. |
| 2015/0034990 | A1* | 2/2015 | Roitman ............. H10H 20/841 257/98 |
| 2016/0343917 | A1 | 11/2016 | Eisert et al. |
| 2018/0040775 | A1 | 2/2018 | Wakamatsu et al. |
| 2018/0040786 | A1 | 2/2018 | Chen |
| 2018/0240950 | A1 | 8/2018 | Jang et al. |
| 2018/0351053 | A1 | 12/2018 | Yuasa et al. |
| 2019/0035987 | A1* | 1/2019 | Yuasa ................ H10H 20/8514 |
| 2019/0115508 | A1 | 4/2019 | Lin et al. |
| 2019/0259916 | A1* | 8/2019 | Iwakura ............... H10H 20/841 |
| 2021/0020811 | A1 | 1/2021 | Kang et al. |
| 2021/0328112 | A1* | 10/2021 | McFarlane .......... H10H 20/851 |
| 2021/0391514 | A1 | 12/2021 | Koyama et al. |

OTHER PUBLICATIONS

International Search Report and Written Opinion for International Patent Application No. PCT/US2021/055547, mailed Mar. 31, 2022, 18 pages.

Non-Final Office Action for U.S. Appl. No. 17/103,121, mailed Dec. 8, 2022, 20 pages.

Advisory Action for U.S. Appl. No. 17/103,121, mailed May 8, 2024, 3 pages.

Non-Final Office Action for U.S. Appl. No. 17/103,121, mailed May 22, 2024, 29 pages.

Final Office Action for U.S. Appl. No. 17/103,121, mailed May 10, 2023, 23 pages.

Advisory Action for U.S. Appl. No. 17/103,121, mailed Jul. 24, 2023, 3 pages.

Non-Final Office Action for U.S. Appl. No. 17/103,121, mailed Sep. 14, 2023, 25 pages.

Final Office Action for U.S. Appl. No. 17/103,121, mailed Feb. 29, 2024, 30 pages.

Final Office Action for U.S. Appl. No. 17/103,121, mailed Oct. 23, 2024, 32 pages.

* cited by examiner

1

COVER STRUCTURE ARRANGEMENTS FOR LIGHT EMITTING DIODE PACKAGES

RELATED APPLICATIONS

This application is a continuation-in-part of U.S. patent application Ser. No. 17/103,121, filed Nov. 24, 2020, the disclosure of which is hereby incorporated herein by reference in its entirety.

FIELD OF THE DISCLOSURE

The present disclosure relates to solid-state lighting devices including light-emitting diodes (LEDs), and more particularly to cover structure arrangements for packaged LED devices.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

LED packages have been developed that can provide mechanical support, electrical connections, and encapsulation for LED emitters. Light emissions that exit surfaces of LED emitters may then interact with elements or surfaces of corresponding LED packages, thereby increasing opportunities for light loss. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs), and more particularly to cover structure arrangements for packaged LED devices. An LED package may include one or more LED chips and a cover structure that is arranged over the one or more LED chips that may provide protection from environmental exposure to underlying portions of the LED package. The cover structure may include arrangements of one or more layers or coatings that may be configured for providing improved emission characteristics for the LED package. The one or more layers or coatings may include antireflective structures, filter structures, and reflective structures individually or in various combinations with one another to provide one or more of improved light output, increased light extraction, improved emission uniformity, and improved emission contrast for the LED package.

The present disclosure further relates to LED packages and corresponding cover structures that include light-absorbing layers configured to absorb certain wavelengths of light while permitting other wavelengths to pass therethrough. Light-absorbing layers may include pigment materials of colors that absorb intended wavelengths of light. In certain aspects, an LED package may include an LED chip configured to emit light of a first peak wavelength and a cover structure that includes a light-absorbing layer with a pigment of a color that absorbs the first peak wavelength. Such an arrangement may be useful for embodiments that also include a lumiphoric material that converts a portion of the first peak wavelength to light of a second peak wavelength. Accordingly, the LED package may predominantly emit light of the second peak wavelength. Exemplary LED packages include so-called phosphor-converted single colors, such as phosphor-converted amber, among others. Cover structures may include one or more combinations of light-absorbing layers, antireflective layers, and reflective layers for providing improved emission characteristics for the LED package.

In one aspect, a light-emitting diode (LED) package comprises: a submount; at least one LED chip on the submount; and a cover structure on the at least one LED chip, the cover structure comprising: a superstrate comprising a top face, a bottom face that opposes the top face, and at least one sidewall that is between the top face and the bottom face, wherein the bottom face is arranged closer to the at least one LED chip than the top face; a lumiphoric material on bottom face of the superstrate; and an antireflective layer on at least one of the top face and the bottom face of the superstrate, wherein the antireflective layer comprises an index of refraction that is different than an index of refraction of the superstrate. In certain embodiments, the antireflective layer is provided as a coating on the top face of the superstrate. In certain embodiments, the index of refraction of the antireflective layer is intermediate the index of refraction of the superstrate and an index of refraction of a surrounding environment that is external to the LED package. In certain embodiments, the antireflective layer is provided as a coating on the bottom face of the superstrate, and the antireflective layer is arranged between the superstrate and the lumiphoric material. In certain embodiments, the index of refraction of the antireflective layer is intermediate the index of refraction of the superstrate and an index of refraction of the lumiphoric material. In certain embodiments, the antireflective layer is a first antireflective layer that is provided as a coating on the top face of the superstrate and the LED package further comprises a second antireflective layer that is provided as a coating on the bottom face of the superstrate. The LED package may further comprise a light-altering material on the submount and arranged around a perimeter of the at least one LED chip, wherein the at least one sidewall of the superstrate and sidewalls of the antireflective layer are covered by the light-altering material. The LED package may further comprise: a light-altering material on the submount and arranged around a perimeter of the at least one LED chip; and a reflective layer on the at least one sidewall of the superstrate, wherein the reflective layer is arranged between the light-altering material and the superstrate. In certain embodiments, the at least one LED chip is configured to provide light of a first peak wavelength and the lumiphoric material is configured to convert at least a portion of the light of the first peak wavelength to light of a second peak wavelength, the LED package further comprising: a filter layer on at least one of the top face and the bottom face of the superstrate, wherein the filter layer is more reflective than transmissive to the first peak wavelength and more transmissive than reflective to the second peak wavelength. In certain embodiments, the antireflective layer is arranged on the top face of the superstrate; the filter layer is arranged on the bottom face of the superstrate; and a reflective layer is arranged on the at least one sidewall of the superstrate. In certain embodiments, the antireflective layer is arranged in a pattern on at least one of the top face and the bottom face of the superstrate. In certain embodiments, the at least one LED chip comprises a contact on a side of the at least one LED chip that is opposite the submount, and the cover structure forms a cut-out portion that corresponds to the contact.

In another aspect, an LED package comprises: a submount; at least one LED chip on the submount, wherein the at least one LED chip is configured to provide light of a first peak wavelength; and a cover structure on the at least one LED chip, the cover structure comprising: a superstrate comprising a top face, a bottom face that opposes the top face, and at least one sidewall that is between the top face and the bottom face, wherein the bottom face is arranged closer to the at least one LED chip than the top face; a lumiphoric material on the bottom face of the superstrate, wherein the lumiphoric material is configured to convert at least a portion of the light of the first peak wavelength to light of a second peak wavelength; and a filter layer on at least one of the top face and the bottom face of the superstrate, wherein the filter layer is more reflective than transmissive to the first peak wavelength and more transmissive than reflective to the second peak wavelength. In certain embodiments, the filter layer comprises a band-pass filter and the first peak wavelength is in a range from 400 nanometers (nm) to 500 nm and the second peak wavelength is either below 400 nm or above 500 nm. In certain embodiments, the filter layer comprises a high-pass filter and the first peak wavelength is below 500 nm and the second peak wavelength is 500 nm or greater. In certain embodiments, the filter layer is arranged between the lumiphoric material and the superstrate on the bottom face of the superstrate. In certain embodiments, the filter layer entirely covers at least one of the top face and the bottom face of the superstrate. In certain embodiments, the filter layer is arranged in a pattern on at least one of the top face and the bottom face of the superstrate. In certain embodiments, the filter layer is arranged on one or more of the top face and the bottom face of the superstrate at a distance from the at least one side wall of the superstrate that is no greater than 20%, or no greater than 5% of an overall dimension of the superstrate. The LED package may further comprise an antireflective layer on a central portion of at least one of the top face and the bottom face of the superstrate. The LED package may further comprise a reflective layer on the at least one sidewall of the superstrate. In certain embodiments, the antireflective layer is arranged in a pattern on at least one of the top face and the bottom face of the superstrate. In certain embodiments, the at least one LED chip comprises a contact on a side of the at least one LED chip that is opposite the submount, and the cover structure forms a cut-out portion that corresponds to the contact.

In another aspect, an LED package comprises: a submount; at least one LED chip on the submount, wherein the at least one LED chip is configured to provide light of a first peak wavelength; and a cover structure on the at least one LED chip, the cover structure comprising a top face, a bottom face that opposes the top face, at least one sidewall that is between the top face and the bottom face, and a lumiphoric material that is configured to convert at least a portion of the light of the first peak wavelength to light of a second peak wavelength; and a filter layer on at least one of the top face and the bottom face of the cover structure, wherein the filter layer is more reflective than transmissive to the first peak wavelength and more transmissive than reflective to the second peak wavelength. In certain embodiments, the cover structure comprises a ceramic phosphor plate. In certain embodiments, the cover structure comprises phosphor material embedded in glass. In certain embodiments, the filter layer comprises a band-pass filter and the first peak wavelength is in a range from 400 nm to 500 nm and the second peak wavelength is either below 400 nm or above 500 nm. In certain embodiments, the filter layer comprises a high-pass filter and the first peak wavelength is below 500 nm and the second peak wavelength is 500 nm or greater. The LED package may further comprise a reflective layer on the at least one sidewall of the cover structure. In certain embodiments, the at least one LED chip comprises a contact on a side of the at least one LED chip that is opposite the submount, and the cover structure forms a cut-out portion that corresponds to the contact.

In another aspect, an LED package comprises: a submount; at least one LED chip on the submount, the at least one LED chip being configured to emit light having a first peak wavelength; and a cover structure on the at least one LED chip, the cover structure comprising a light-absorbing layer with a pigment material that absorbs the first peak wavelength. The LED package may further comprise a lumiphoric material that is arranged between the light-absorbing layer and the at least one LED chip, the lumiphoric material being configured to convert a portion of the light of the first peak wavelength to light of a second peak wavelength. In certain embodiments, the light-absorbing layer is light-transparent to the light of the second peak wavelength. In certain embodiments, the first peak wavelength is in a range from 430 nanometers (nm) to 480 nm and the second peak wavelength is in a range from greater than 500 nm to 650 nm. In certain embodiments, the cover structure comprises a superstrate, wherein the superstrate is arranged between the lumiphoric material and the light-absorbing layer. In certain embodiments, the light-absorbing layer is further arranged on at least one sidewall of the superstrate. The LED package may further comprise a light-altering material on the submount and arranged around a perimeter of the at least one LED chip, wherein sidewalls of the cover structure are covered by the light-altering material. In certain embodiments, sidewalls of the light-absorbing layer are at least partially covered by the light-altering material. In certain embodiments, the cover structure further comprises a reflective layer on at least one sidewall of the superstrate such that the reflective layer is between the superstrate and the light-altering material. In certain embodiments, the cover structure further comprises an antireflective layer, and wherein the light-absorbing layer is between the antireflective layer and the at least one LED chip. In certain embodiments, the cover structure further comprises an antireflective layer and the antireflective layer is between the light-absorbing layer and the at least one LED chip. In certain embodiments, the cover structure further comprises: a lumiphoric material that is arranged between the light-absorbing layer and the at least one LED chip a superstrate that is arranged between the lumiphoric material and the light-absorbing layer; a first antireflective layer; and a second antireflective layer, wherein the superstrate is between the first antireflective layer and the second antireflective layer.

In another aspect, an LED package comprises: a submount; at least one LED chip on the submount, the at least one LED chip being configured to emit light having a first peak wavelength; a lumiphoric material that is arranged to convert a portion of the light of the first peak wavelength to light of a second peak wavelength; and a light-absorbing layer with a pigment material that absorbs the first peak wavelength, the lumiphoric material being arranged between the light-absorbing layer and the at least one LED chip. In certain embodiments, the light-absorbing layer is light-transparent to the light of the second peak wavelength. In certain embodiments, the lumiphoric material comprises a ceramic phosphor plate. In certain embodiments, the lumiphoric material comprises phosphor material embedded in glass. In certain embodiments, the light-absorbing layer is further arranged on at least one sidewall of the lumiphoric material. The LED package may further comprise: a reflective layer on at least one sidewall of the lumiphoric material; and a light-altering material on the submount and around a perimeter of the at least one LED chip such that the reflective layer is between the lumiphoric material and the light-altering material. The LED package may further comprise an antireflective layer such that the light-absorbing layer is between the antireflective layer and the at least one LED chip. The LED package may further comprise an antireflective layer such that the antireflective layer is between the light-absorbing layer and the at least one LED chip.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figures 1, 2:
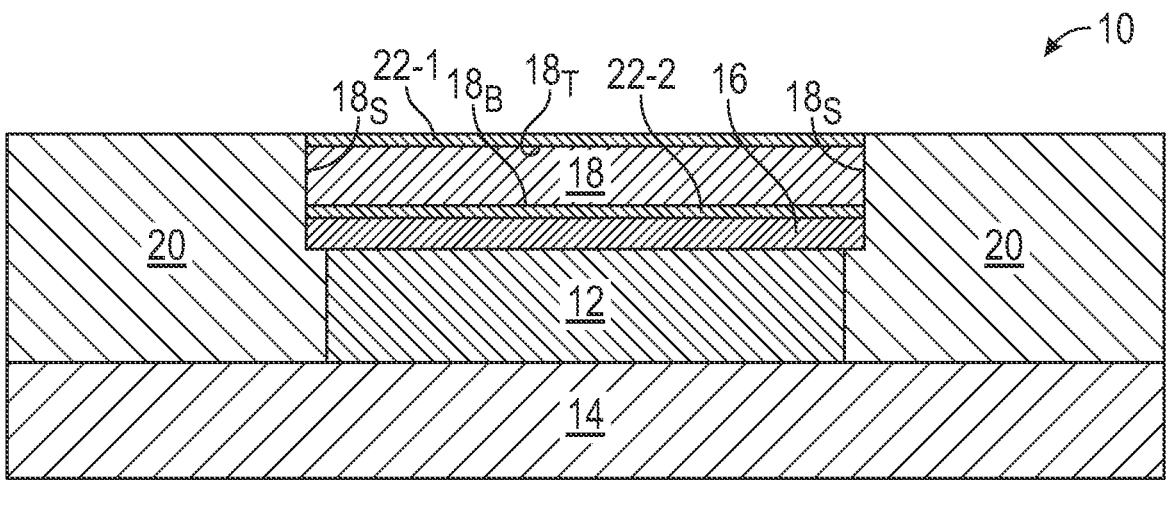
FIG. 1 is a cross-sectional view of a light-emitting diode (LED) package that includes an LED chip on a submount and further includes exemplary antireflective structures for increasing overall light output according to principles of the present disclosure.
FIG. 2 is a cross-sectional view of an LED package that is similar to the LED package of FIG. 1 and includes exemplary reflective structures for increasing overall light output according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs), and more particularly to cover structure arrangements for packaged LED devices. An LED package may include one or more LED chips and a cover structure that is arranged over the one or more LED chips that may provide protection from environmental exposure to underlying portions of the LED package. The cover structure may include arrangements of one or more layers or coatings that may be configured for providing improved emission characteristics for the LED package. The one or more layers or coatings may include antireflective structures, filter structures, and reflective structures individually or in various combinations with one another to provide one or more of improved light output, increased light extraction, improved emission uniformity, and improved emission contrast for the LED package.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, one or more surfaces of LED chips may be conformally coated with one or more lumiphoric materials, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element. Wavelength conversion elements may include a support element, such as a superstrate, and one or more lumiphoric materials that are provided by any suitable means, such as by coating a surface of the superstrate or by incorporating within the superstrate. The term "superstrate" as used herein refers to an element placed on or over an LED chip that may include a lumiphoric material. The term "superstrate" is used herein, in part, to avoid confusion with other substrates that may be part of the semiconductor light-emitting device, such as a growth or carrier substrate of the LED chip or a submount of an LED package. The term "superstrate" is not intended to limit the orientation, location, and/or composition of the structure it describes. In some embodiments, the superstrate may be composed of a transparent material, a semi-transparent material, or a light-transmissive material, such as sapphire, SiC, silicone, and/or glass (e.g., borosilicate and/or fused quartz). Superstrates may be patterned to enhance light extraction as described in commonly-assigned U.S. Patent Application Publication No. 2019/0326484 entitled "Semiconductor Light Emitting Devices Including Superstrates With Patterned Surfaces" which is hereby incorporated by reference herein. Superstrates may also be configured as described in commonly-assigned U.S. Pat. No. 10,290,777, also incorporated by reference herein. Superstrates may be formed from a bulk substrate which is optionally patterned and then singulated. In certain embodiments, the patterning of a superstrate may be performed by an etching process (e.g., wet or dry etching). In certain embodiments, the patterning of a superstrate may be performed by otherwise altering the surface, such as by a laser or saw. In certain embodiments, the superstrate may be thinned before or after the patterning process is performed. In certain embodiments, superstrates may comprise a generally planar upper surface that corresponds to a light emission area of the LED package.

One or more lumiphoric materials may be arranged on the superstrate by, for example, spraying and/or otherwise coating the superstrate with the lumiphoric materials. Wavelength conversion elements may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In other embodiments, wavelength conversion elements may comprise alternative configurations, such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflective layer and a dielectric reflective layer, wherein the dielectric reflective layer is arranged between the metal reflective layer and a plurality of semiconductor layers. A passivation layer is arranged between the metal reflective layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. In certain embodiments, a vertical geometry or lateral geometry LED chip may be configured as set forth in the commonly-assigned U.S. Pat. No. 9,461,201, which is hereby incorporated by reference herein. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In certain embodiments, the flip-chip LED chip may be configured as described in commonly-assigned U.S. Patent Application Publication No. 2017/0098746, which is hereby incorporated by reference herein. In other embodiments, an active LED structure may be bonded to a carrier submount, and the growth substrate may be removed such that light may exit the active LED structure without passing through the growth substrate. In certain embodiments, an LED package may be configured as set forth in the following commonly-assigned U.S. patents, which are hereby incorporated by reference herein: U.S. Pat. Nos. 8,866,169; 9,070,850; 9,887,327; and 10,468,565.

According to aspects of the present disclosure LED packages may include one or more elements, such as lumiphoric materials, encapsulants, light-altering materials, lens, and electrical contacts, among others, that are provided with one or more LED chips. In certain aspects, an LED package may include a support member, such as a submount or a leadframe. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects light-reflective particles may also be referred to as light-scattering particles. A weight ratio of the light-reflective particles or scattering particles to a binder may comprise a range of about 1:1 to about 2:1. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast.

In certain embodiments, the light-altering material includes both light-reflective material and light-absorbing material suspended in a binder. A weight ratio of the light-reflective material to the binder may comprise a range of about 1:1 to about 2:1. A weight ratio of the light-absorbing material to the binder may comprise a range of about 1:400 to about 1:10. In certain embodiments, a total weight of the light-altering material includes any combination of the binder, the light-reflective material, and the light-absorbing material. In some embodiments, the binder may comprise a weight percent that is in a range of about 10% to about 90% of the total weight of the light-altering material. The light-reflective material may comprise a weight percent that is in a range of about 10% to about 90% of the total weight of the light-altering material. The light-absorbing material may comprise a weight percent that is in a range of about 0% to about 15% of the total weight of the light-altering material.

In further embodiments, the light-absorbing material may comprise a weight percent that is in a range of about greater than 0% to about 15% of the total weight of the light-altering material. In further embodiments, the binder may comprise a weight percent that is in a range of about 25% to about 70% of the total weight of the light-altering material. The light-reflective material may comprise a weight percent that is in a range of about 25% to about 70% of the total weight of the light-altering material. The light-absorbing material may comprise a weight percent that is in a range of about 0% to about 5% of the total weight of the light-altering material. In further embodiments, the light-absorbing material may comprise a weight percent that is in a range of about greater than 0% to about 5% of the total weight of the light-altering material.

In certain aspects, light-altering materials may be provided in a preformed sheet or layer that includes light-altering particles suspended in a binder. For example, light-altering particles may be suspended in a binder of silicone that is not fully cured to provide the preformed sheet of light-altering materials. A desired thickness or height of the preformed sheet may be provided by moving a doctor blade or the like across the sheet. The preformed sheet may then be positioned on and subsequently formed around an LED chip and/or a wavelength conversion element that is on the LED chip. For example, the preformed sheet may be laminated around the LED chip and/or wavelength conversion element and then the preformed sheet may be fully cured in place. One or more portions of the preformed sheet may then be removed from a primary light-emitting face of the LED chip and/or wavelength conversion element. In this manner, light-altering materials may be formed along peripheral edges or sidewalls of the LED chip and wavelength conversion element with thicknesses not previously possible with conventional dispensing techniques typically used to form light-altering materials. Additionally, light-altering materials may be provided without needing conventional submounts or lead frames as support for conventional dispensing and/or molding techniques. In this regard, LED devices with light-altering materials may be provided with reduced footprints suitable for closely-spaced LED arrangements.

Aspects of the present disclosure are provided that may include specific arrangements of one or more layers or coatings that may be provided on cover structures for LED packages for improving emission characteristics. Such cover structures may include hard and mechanically robust structures that are positioned over one or more LED chips within an LED package. A cover structure may be configured to provide protection from environmental exposure to underlying portions of an LED package, thereby providing a more robust LED package that is well suited for applications that require high power with increased light intensity, contrast, and reliability, such as interior and exterior automotive applications. The one or more layers may include antireflective layers or coatings, filter layers or coatings, and reflective layers or coatings individually or in various combinations to provide one or more of improved light output, increased light extraction, improved emission uniformity, and improved emission contrast for LED packages. In various aspects, the one or more layers may include but are not limited to inorganic materials, dielectric materials, and metal materials.

As used herein, an antireflective layer or coating may include one or more layers that provide an index of refraction this selected to reduce the reflection or refraction of light at an interface thereof. In certain embodiments, antireflective layers as disclosed herein may comprise single or multiple thin layers that transition from the index of refraction of one side of the interface to the other. In this regard, an antireflective layer may provide a graded index of refraction with values in a range between a first index of refraction associated with a first medium on one side of the interface and a second index of refraction associated with a second medium that is on the other side of the interface. Advantageously, by using the antireflective layer to transition between the different mediums, abrupt index of refraction changes may be avoided, which may reduce the amount of light reflected internally at the interface. Antireflective layers may include many different materials, including but not limited to one or more oxides of silicon (e.g., $SiO_2$), oxides of zirconium (e.g., $ZrO_2$), oxides of aluminum (e.g., $Al_2O_3$), oxides of titanium (e.g., $TiO_2$), oxides of indium (e.g., $In_2O_3$), indium tin oxide (ITO), silicon nitride (e.g., $SiN_x$), magnesium fluoride (e.g., $MgF_2$), cerium fluoride (e.g., $CeF_3$), fluoropolymers, and combinations thereof. Relative thicknesses of antireflective layers or sub-layers within a multi-layer antireflective structure may comprise one or more combinations of quarter-wavelength and half-wavelength values of target light, for example the wavelength of light emitted by an LED chip and/or a wavelength of light provided by lumiphoric materials. Specific arrangements of antireflective layers or coatings in LED packages are disclosed that may provide a general reduction in the rate of total internal reflection at various interfaces, thereby improving the overall brightness of the LED packages. Such interfaces may include ones that are in a light path of a desired emission direction of the LED package as well as various interfaces that do not couple to external optics or in directions away from a desired emission direction.

As used herein, a filter layer or coating may include multiple sub-layer arrangements with variable thickness and/or index of refraction differences that collectively provide the ability to pass certain wavelengths of light while reflecting or otherwise redirecting other wavelengths of light. In various arrangements, filter layers as described herein may include one or more of a band-pass filter, a high-pass filter, a low-pass filter, and a notch or band-stop filter. A band-pass filter may be configured to promote wavelengths within a particular range to pass through while reflecting wavelengths outside of the particular range. A low-pass filter may promote wavelengths below a certain value to pass through while reflecting higher wavelengths. A high-pass filter may promote wavelengths above a certain value to pass through while reflecting lower wavelengths. Finally, a notch or band-stop filter may promote wavelengths within a particular range to be reflected while promoting wavelengths outside of the particular range to pass through. By way of non-limiting example, a band-pass filter may include alternating layers with alternating index of refraction materials (e.g., high-low) where relative layer thicknesses are chosen specifically to promote constructive interference for a specific wavelength band while reflecting wavelengths outside of the specific wavelength band. Filter layers according to the present disclosure may include any of the materials and combinations thereof as provided for the antireflective layers described above. Specific arrangements of filter layers or coatings in LED packages are disclosed that may promote reflection of unconverted light (e.g., from an LED chip) back into lumiphoric materials, thereby improving light-conversion efficiency and allowing potential reduction in thickness of the lumiphoric materials. Such reduction in thickness and corresponding amounts of lumiphoric material may further serve to reduce heat generation from the lumiphoric material during operation. In the example of a blue LED chip with a longer wavelength lumiphoric material, an exemplary filter layer may be configured to reduce the amount of unconverted blue light that is emitted, thereby increasing long term eye safety and reducing damage and/or fading of pigments in the LED package or external to the LED package.

As used herein, a reflective layer or coating may include one or more layers of dielectric and/or metal materials that are configured to primarily reflect visible wavelengths of light. For example, a reflective layer or coating may include one or more of a dielectric or oxide layer such as $SiO_2$, a multiple layer dielectric reflector such as a periodic or aperiodic Bragg reflector, and a reflective metal layer. In still further embodiments, a reflective layer or coating may include light-altering particles that are suspended in a binder in a similar manner as other light-altering materials described herein. In such embodiments, a loading of light-altering materials in a binder for the reflective layer may be higher, lower, or even the same as the other light-altering materials.

FIG. 1 is a cross-sectional view of an LED package 10 that includes an LED chip 12 on a submount 14 and further includes exemplary antireflective structures for increasing overall light output according to principles of the present disclosure. The LED chip 12 may be mounted to and electrically coupled to one or more electrical traces that are provided on the submount 14. In certain embodiments, the LED chip 12 may be flip-chip mounted such that an anode and a cathode of the LED chip 12 are mounted to and electrically coupled with different electrical traces that are provided on the submount 14. The LED package 10 may further include a lumiphoric material 16 on the LED chip 12. In certain embodiments, the lumiphoric material 16 may be supported by a superstrate 18, or support element, that comprises a light-transmissive material such as glass, sapphire, or the like. The combination of the lumiphoric material 16 and the superstrate 18, when present, may be referred to as a wavelength conversion element. In this regard, the lumiphoric material 16 and the superstrate 18 form a cover structure that is arranged over the LED chip 12 in the LED package 10. The cover structure may also be referred to as a lens or even a flat lens structure for the LED package 10, depending on its shape. The superstrate 18 of the cover structure is positioned as an exterior and light-emitting surface for the LED package 10. In this regard, the superstrate 18 may provide protection from environmental exposure to underlying portions of the LED package 10. The cover structure formed by the superstrate 18 and the lumiphoric material 16 may be mounted to the LED chip 12 with a transparent adhesive material, such as silicone, and peripheral edges of the superstrate 18 and the lumiphoric material 16 may be retained within a light-altering material 20.

Light that is generated by the active region of the LED chip 12 may be omnidirectional in nature and LED packages are typically designed with features that are arranged to redirect light from the active region toward a desired emission direction. For example, a desired emission direction for the LED package 10 of FIG. 1 may be perpendicular with an interface between the LED chip 12 and the submount 14. As light is generated omnidirectionally by the LED chip 12 and must pass through multiple interfaces within the LED package 10, not all light may ultimately emit from the LED package 10 in the desired emission direction. For example, some light may traverse laterally within the LED chip 12 and may refract laterally within the LED package 10, such as at an interface between the LED chip 12 and the lumiphoric material 16. In this regard, the light-altering material 20 can be arranged around a perimeter of the LED chip 12 on the submount 14 to reflect or otherwise redirect light toward the desired emission direction. In various configurations, the light-altering material 20 may comprise light-altering particles such as one or more of fused silica, fumed silica, zinc oxides, tantalum oxides, zirconium oxides, niobium oxides, yttrium oxides, alumina, glass beads, and $TiO_2$ that are suspended or embedded within a binder such as silicone or epoxy. In many applications, the light-altering material 20, including the light-altering particles are selected to reflect broad spectrum white light including photons ranging in wavelength from 400 nm to 700 nm.

In order for light to pass in a desired emission direction, light from the LED chip 12 may traverse through the lumiphoric material 16 and the superstrate 18 in order to escape the LED package 10, either directly or after reflections with one or more of the substrate 14 and the light-altering material 20. Each of the LED chip 12, the lumiphoric material 16, the superstrate 18, and the external environment (e.g., air, or other fixture environments) above the superstrate 18 may have a different index of refraction. As such, light traversing through each interface may refract along a different angle according to the principles of Snell's law. In order to reduce amounts of light that may refract in undesired directions, the LED package 10 may comprise one or more antireflective layers 22-1, 22-2 in the light path of the desired emission direction. In FIG. 1, the desired emission direction is generally through a top surface of the superstrate 18 that is opposite the substrate 14. In this manner, a first antireflective layer 22-1 may be provided on a top face 18T of the superstrate 18 that is opposite a bottom face 18B of the superstrate 18, where the bottom face 18B is closer to the LED chip 12. As illustrated, one or more sidewalls 18s of the superstrate 18 may be arranged between the top face 18T and the bottom face 18B. The first antireflective layer 22-1 may comprise an index of refraction that is intermediate the respective indexes of refraction of the superstrate 18 and the surrounding external environment above the LED package 10. In certain embodiments, the first antireflective layer 22-1 may comprise a single layer or multiple sub-layers with progressively stepped indexes of refraction. In embodiments where the substrate 14 comprises glass, about 4% of the light may otherwise be reflected or refracted at the interface between the superstrate 18 and an external environment to the LED package 10. When the first antireflective layer 22-1 is provided on the top face 18T, the amount of light reflected or refracted at this interface may be reduced to less than 1%, thereby increasing the overall brightness of the LED package 10. The LED package 10 may include a second antireflective layer 22-2 that is provided on the bottom face 18B of the superstrate 18 at the interface between the superstrate 18 and the lumiphoric material 16, thereby reducing reflection or refraction at this interface. The second antireflective layer 22-2 may comprise an index of refraction that is intermediate the respective indexes of refraction of the superstrate 18 and at least one of the lumiphoric material 16 and the LED chip 12. In certain embodiments, the second antireflective layer 22-2 may comprise a single layer or multiple sub-layers with progressively stepped indexes of refraction. In certain embodiments, the LED package 10 may include only one of the antireflective layer 22-1, 22-2, while in other embodiments, the LED package 10 may include both of the antireflective layers 22-1, 22-2.

In certain embodiments, the antireflective layers 22-1, 22-2 may be formed on the superstrate 18 before it is attached or mounted to the LED package 10. For example, the superstrate 18 may be formed from a larger bulk superstrate material that is singulated for placement in the LED package 10. In this regard, the antireflective layers 22-1, 22-2 may be formed or otherwise deposited on the larger bulk superstrate material before singulation. Accordingly, the antireflective layers 22-1, 22-2 may be formed to cover the entire top face 18T and/or the entire bottom face 18B of the superstrate 18 in certain embodiments, such that peripheral edges of the antireflective layers 22-1, 22-2 are coplanar or self-aligned with peripheral edges of the superstrate 18. Additionally, peripheral edges of the antireflective layers 22-1, 22-2 may be arranged in contact with the light-altering material 20. In other embodiments and depending on the desired emission characteristics, the antireflective layers 22-1, 22-2 may be patterned on the superstrate 18 in a manner that does not cover the entire top face 18T and/or the entire bottom face 18B of the superstrate 18. As illustrated, portions of the light-altering material 20 may be arranged to surround and/or cover peripheral edges or sidewalls of the superstrate 18 (e.g., sidewalls 18s), the lumiphoric material 16 and one or more of the antireflective layers 22-1, 22-2 to redirect light emissions in the desired emission direction.

FIG. 2 is a cross-sectional view of an LED package 24 that is similar to the LED package 10 of FIG. 1 and includes exemplary reflective structures for increasing overall light output according to principles of the present disclosure. In the example of FIG. 2, the exemplary reflective structure is embodied by a reflective layer 26 that is arranged on one or more sidewalls 18s of the superstrate 18. In this manner, light from one or more of the LED chip 12 and the lumiphoric material 16 that traverses laterally within the superstrate 18 may be reflected at the sidewalls 18s, thereby increasing the likelihood of such light being provided in a desired emission direction. In certain embodiments, the reflective layer 26 may be provided with a reflectivity that is higher than a reflectivity of the light-altering material 20. In this manner, the reflective layer 26 may provide an even sharper or more well-defined light emitting surface of the LED package 24. Such an arrangement may be well suited for use in applications where a high contrast for the light-emitting surface of the LED package 24 is required. In certain embodiments, the reflective layer 26 as illustrated in FIG. 2 may be combined with one or more of the antireflective layers 22-1, 22-2 as illustrated in FIG. 1.

Figure 3:
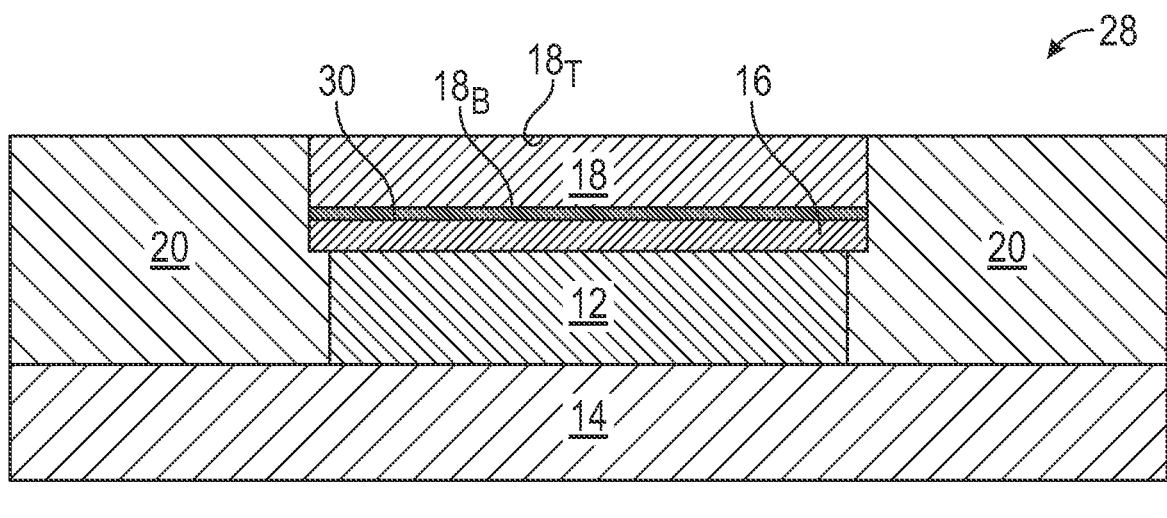
FIG. 3 is a cross-sectional view of an LED package that is similar to the LED package of FIG. 1 and includes exemplary filter structures for increasing overall light output and/or increasing emission uniformity according to principles of the present disclosure.

FIG. 3 is a cross-sectional view of an LED package 28 that is similar to the LED package 10 of FIG. 1 and includes exemplary filter structures for increasing overall light output and/or increasing emission uniformity according to principles of the present disclosure. In the example of FIG. 3, the exemplary filter structure is embodied by a filter layer 30 that is arranged on the bottom face 18B of the superstrate 18. In certain embodiments, the filter layer 30 may be configured to primarily reflect wavelengths of light generated by the LED chip 12 while allowing wavelengths of the light that are converted by the lumiphoric material 16 to pass through to the superstrate 18. In this regard, unconverted light from the LED chip 12 that would otherwise pass into the superstrate 18 may be redirected back into the lumiphoric material 16, thereby increasing the likelihood that such light will be converted. In a particular example, the LED chip 12 may be configured to provide blue light and the lumiphoric material 16 may be configured to provide one or more of yellow, green, and red light. As such, the filter layer 30 may embody a band-pass filter that is configured to be transmissive to a majority of light with a peak wavelength in a range from 400 nm to 500 nm and reflective to a majority of light with a peak wavelength that is either below 400 nm or above 500 nm. In further embodiments, the wavelength band of the band-pass filter may be set at different values, such as 440 nm to 480 nm, or 450 nm to 470, or 440 nm to 500 nm, or 440 nm to 515 nm, or 440 to 530 nm, depending on the desired light emission characteristics of the LED package 28. In other embodiments, the filter layer 30 may be configured as a high-pass filter that is transmissive to a majority of light with a peak wavelength of 500 nm or greater and reflective to a majority of light with a peak wavelength that is below 500 nm. In further embodiments, the wavelength cut-off for the high-pass filter may be provided at different wavelengths, such as one or more of 480 nm, 490 nm, 515 nm, or 530 nm, depending on the desired light emission characteristics of the LED package 28. While the filter layer 30 is illustrated on the bottom face 18B of the superstrate 18, the filter layer 30 may also be provided on the top face 18T of the superstrate 18 or separate filter layers 30 may be provide on both the top face 18T and the bottom face 18B without deviating from the principles of the present disclosure.

As with the antireflective layers 22-1, 22-2 of FIG. 1, the filter layer 30 may be formed on the superstrate 18 before it is attached or mounted to the LED package 28. In this regard, the filter layer 30 may be formed or otherwise deposited on a larger bulk superstrate material before singulation and accordingly, the filter layer 30 may be formed to cover the entire top face 18T and/or the entire bottom face 18B of the superstrate 18 in certain embodiments, such that peripheral edges of the filter layer 30 are coplanar or self-aligned with peripheral edges of the superstrate 18. Additionally, peripheral edges of the filter layer 30 may be arranged in contact with the light-altering material 20. In other embodiments and depending on the desired emission characteristics, the filter layer 30 may be patterned on the superstrate 18 in a manner that does not cover the entire top face 18T and/or the entire bottom face 18B of the superstrate 18. In certain embodiments, the filter layer 30 as illustrated in FIG. 3 may be combined with one or more of the reflective layer 26 as illustrated in FIG. 2 and the antireflective layers 22-1, 22-2 as illustrated in FIG. 1.

Figure 4:
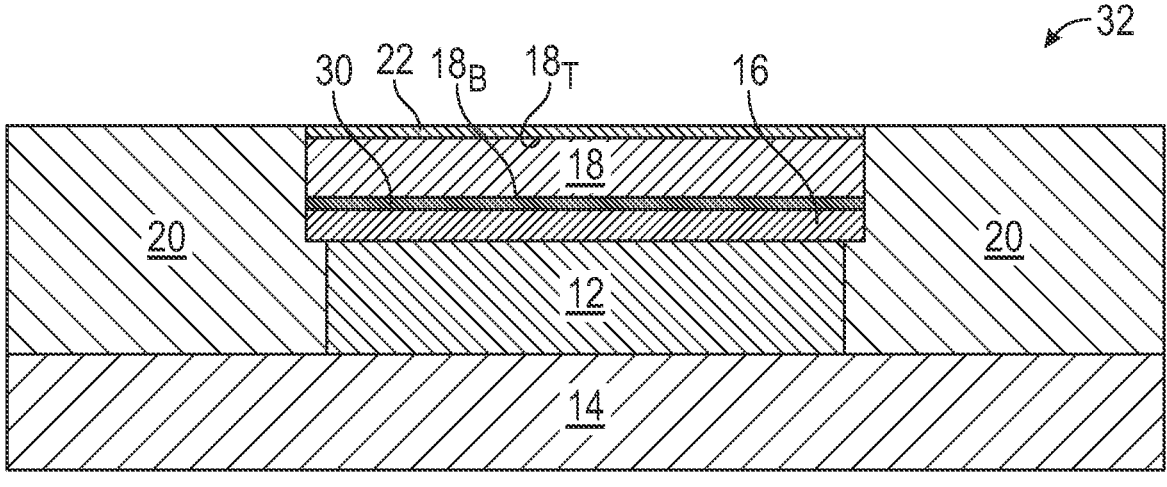
FIG. 4 is a cross-sectional view of an LED package that is similar to the LED package of FIG. 1 and includes both the antireflective layer of FIG. 1 and the filter layer of FIG. 3 according to principles of the present disclosure.

FIG. 4 is a cross-sectional view of an LED package 32 that is similar to the LED package 10 of FIG. 1 and includes both an antireflective layer 22 and the filter layer 30 for increasing overall light output according to principles of the present disclosure. As illustrated, the antireflective layer 22 may be provided on the top face 18T of the superstrate 18 as described for FIG. 1 and the filter layer 30 may be provided on the bottom face 18B of the superstrate 18 as described for FIG. 3. In this manner, unconverted light from the LED chip 12 may be redirected back into the lumiphoric material 16 by the filter layer 30 and converted light that reaches the top face 18T and the antireflective layer 22 may be more likely to escape the superstrate 18, thereby increasing the overall light output for the LED package 32.

Figure 5:
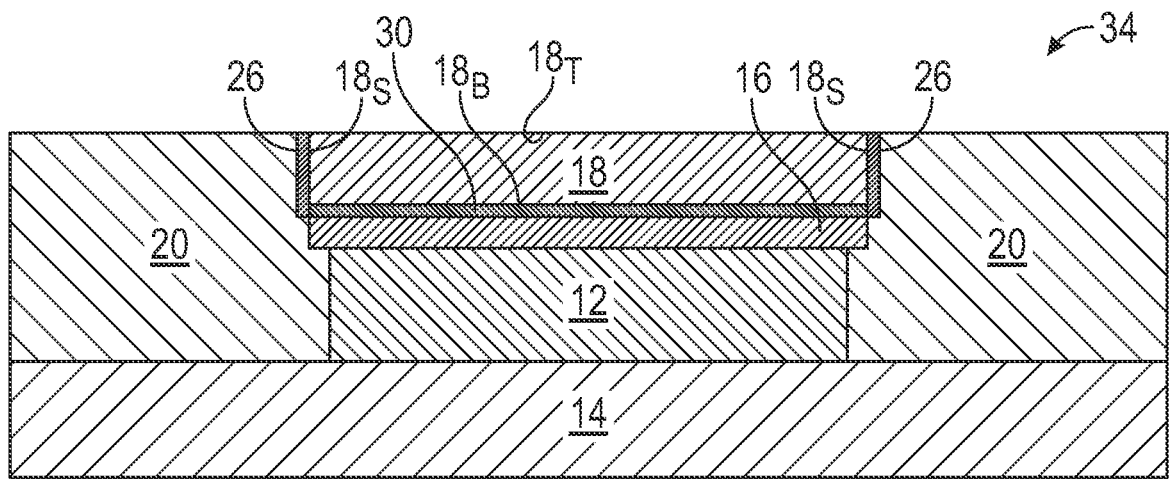
FIG. 5 is a cross-sectional view of an LED package that is similar to the LED package of FIG. 1 and includes both the reflective layer of FIG. 2 and the filter layer of FIG. 3 according to principles of the present disclosure.

FIG. 5 is a cross-sectional view of an LED package 34 that is similar to the LED package 10 of FIG. 1 and includes both the reflective layer 26 and the filter layer 30 for increasing overall light output according to principles of the present disclosure. As illustrated, the reflective layer 26 may be provided on one or more of the sidewalls 18s of the superstrate 18 as described for FIG. 2 and the filter layer 30 may be provided on the bottom face 18B of the superstrate 18 as described for FIG. 3. In this manner, unconverted light from the LED chip 12 may be redirected back into the lumiphoric material 16 by the filter layer 30 and converted light that reaches the sidewalls 18s of the superstrate 18 may reflect toward a desired emission direction by the reflective layer 26, thereby increasing the overall light output for the LED package 34.

Figure 6:
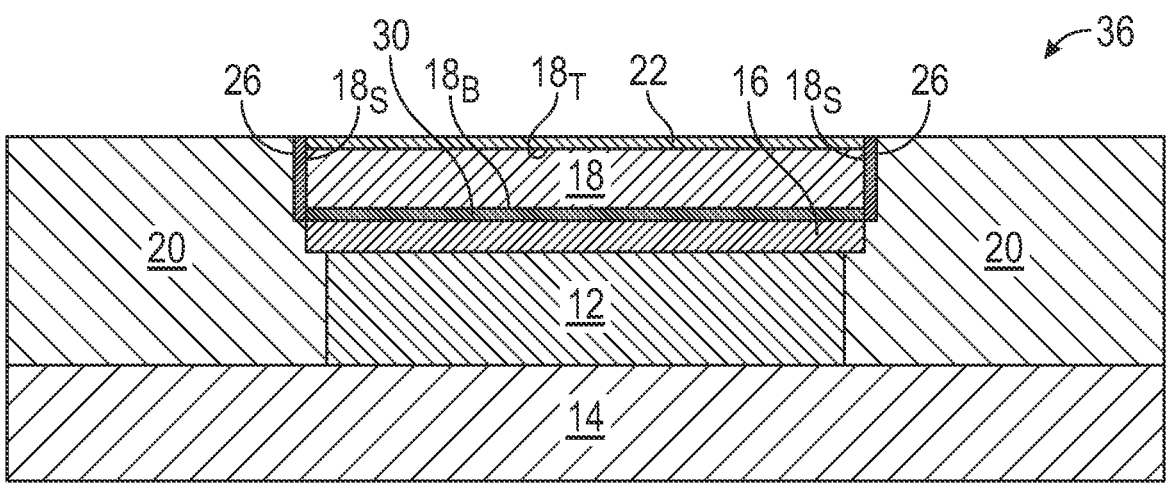
FIG. 6 is a cross-sectional view of an LED package that is similar to the LED package of FIG. 1 and includes the antireflective layer of FIG. 1, the reflective layer of FIG. 2, and the filter layer of FIG. 3 according to principles of the present disclosure.

FIG. 6 is a cross-sectional view of an LED package 36 that is similar to the LED package 10 of FIG. 1 and includes the antireflective layer 22, the reflective layer 26, and the filter layer 30 for increasing overall light output according to principles of the present disclosure. As illustrated, the antireflective layer 22 may be provided on the top face 18T of the superstrate 18 as described for FIG. 1, the reflective layer 26 may be provided on one or more of the sidewalls 18s of the superstrate 18 as described for FIG. 2, and the filter layer 30 may be provided on the bottom face 18B of the superstrate 18 as described for FIG. 3. In this manner, unconverted light from the LED chip 12 may be redirected back into the lumiphoric material 16 by the filter layer 30, converted light that reaches the sidewalls 18s of the superstrate 18 may reflect toward a desired emission direction by the reflective layer 26, and converted light that reaches the top face 18T and the antireflective layer 22 may be more likely to escape the superstrate 18, thereby increasing the overall light output for the LED package 36.

Figure 7:
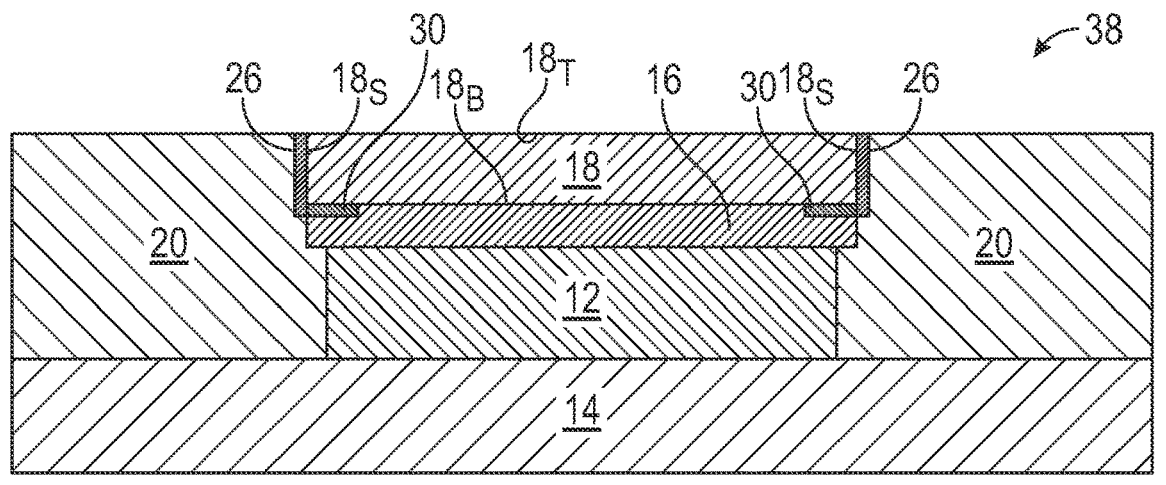
FIG. 7 is a cross-sectional view of an LED package that is similar to the LED package of FIG. 1 and includes a particular arrangement of the reflective layer and the filter layer according to principles of the present disclosure.

FIG. 7 is a cross-sectional view of an LED package 38 that is similar to the LED package 10 of FIG. 1 and includes an arrangement of the reflective layer 26 on one or more sidewalls 18s of the superstrate 18 and the filter layer 30 that is patterned on the superstrate 18. As previously described, the filter layer 30 does not have to cover the entire top face 18T and/or bottom face 18B of the superstrate 18. In the example provided by the LED package 38, the filter layer 30 is only provided along a periphery of the bottom face 18B of the superstrate 18 that is close to the sidewalls 18s of the superstrate 18. In certain embodiments, the filter layer 30 may be provided on one or more of the top face 18T and the bottom face 18B at a distance from the sidewall 18s that is no farther than 20%, or 15%, or 10%, or 5% of an overall lateral dimension (or length) of the bottom face 18B or the top face 18T of the superstrate 18. In this regard, unconverted light from the LED chip 12 may be redirected back into the lumiphoric material 16 along the periphery of the superstrate 18 while unconverted light from the LED chip 12 may be allowed to pass into central portions of the superstrate 18. Such an arrangement may be useful for improving an emission uniformity of the LED package 38 where unconverted light and converted light may be suitably mixed before exiting the LED package 38. In particular, this arrangement may discourage formation of unconverted light rings in lateral portions of a light emission pattern provided by the LED package 38. Additionally, the reflective layer 26 may be optionally provided to further reflect lateral light emissions and tailor the overall light emission pattern of the LED package 38. In other embodiments, the filter layer 30 may be patterned in different arrangements along one or more of the top face 18T and/or the bottom face 18B of the superstrate 18. For example, the filter layer 30 may be provided in a discontinuous pattern across central and/or perimeter portions of the superstrate 18, thereby providing the ability to tailor mixing of unconverted and converted light that may escape the LED package 38 to a particular application.

Figure 8:
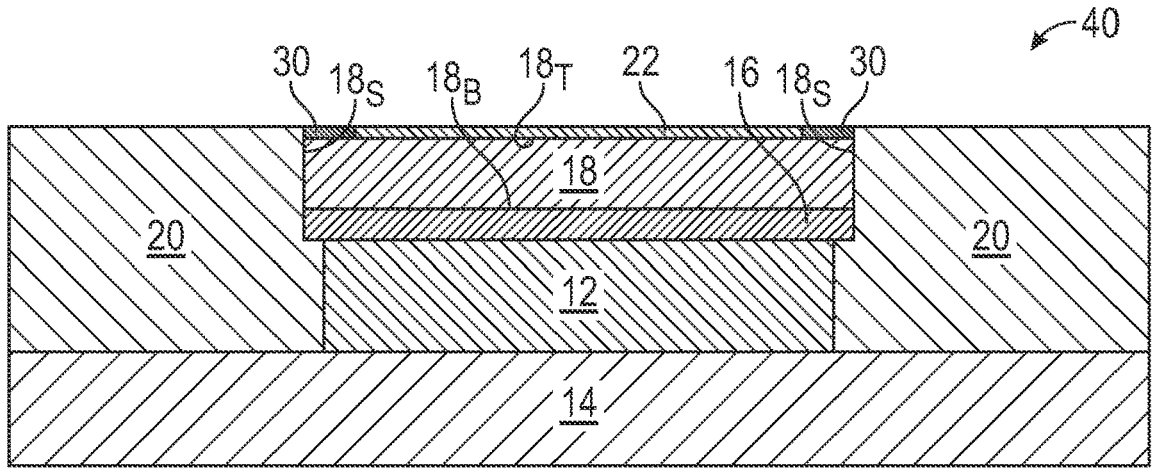
FIG. 8 is a cross-sectional view of an LED package that is similar to the LED package of FIG. 1 and includes a particular arrangement of the filter layer and the antireflective layer according to principles of the present disclosure.

FIG. 8 is a cross-sectional view of an LED package 40 that is similar to the LED package 10 of FIG. 1 and includes an arrangement of the filter layer 30 and the antireflective layer 22 that are patterned on the superstrate 18. As previously described, the antireflective layer 22 and/or the filter layer 30 do not have to cover the entire top face 18T and/or bottom face 18B of the superstrate 18. In the example provided by the LED package 40, the filter layer 30 is only provided along a periphery of the top face 18T (or bottom face 18B) of the superstrate 18 that is close to the sidewalls 18s of the superstrate 18 and the antireflective layer 22 is patterned along central portions of the superstrate 18. For example, the filter layer 30 may be provided on one or more of the top face 18T and the bottom face 18B at a distance from the sidewall 18s that is no farther than 20%, or 15%, or 10%, or 5% of an overall lateral dimension of the bottom face 18B or the top face 18T of the superstrate 18. In this regard, unconverted light from the LED chip 12 may be redirected back into the superstrate 18 and toward the lumiphoric material 16 along the periphery of the superstrate 18 while unconverted light from the LED chip 12 may be allowed to reach the antireflective layer 22 along central portions of the top face 18T. In a similar manner to the LED package 38 of FIG. 7, such an arrangement may be useful for improving an emission uniformity of the LED package 38 where unconverted light and converted light may be suitably mixed before exiting the LED package 40. In further embodiments, the reflective layer 26 as provided in FIG. 7 may also be arranged on the sidewalls 18s of the superstrate 18 in FIG. 8. Additionally, one or more of the filter layer 30 and the antireflective layer 22 may be patterned in different arrangements along one or more of the top face 18T and/or the bottom face 18B of the superstrate 18, such as one or more discontinuous patterns across central and/or perimeter portions of the superstrate 18, thereby providing the ability to tailor mixing of unconverted and converted light that may escape the LED package 40 to a particular application.

Figure 9:
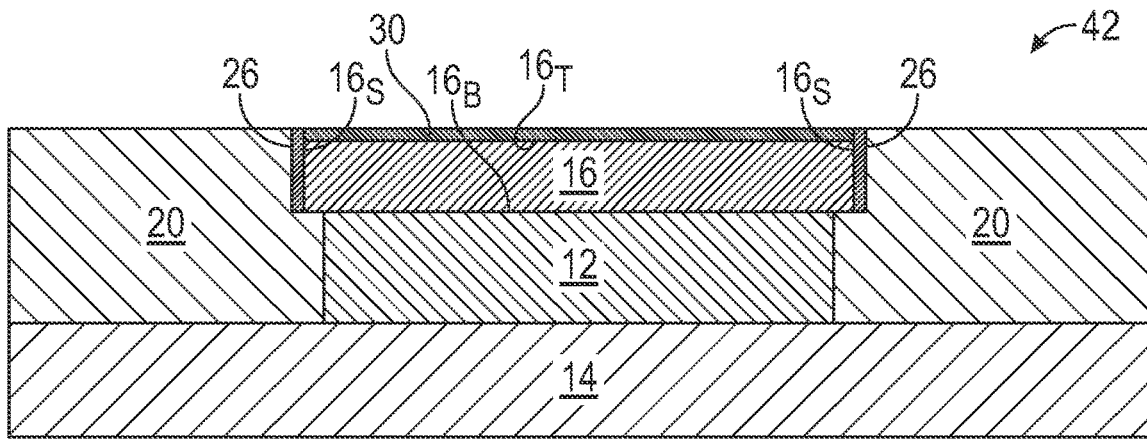
FIG. 9 is a cross-sectional view of an LED package that is similar to the LED package of FIG. 1 and where a cover structure is devoid of the superstrate of FIG. 1 according to principles of the present disclosure.

FIG. 9 is a cross-sectional view of an LED package 42 that is similar to the LED package 10 of FIG. 1 and where a cover structure is devoid of the superstrate 18 of previous embodiments. In certain embodiments, the lumiphoric material 16 may be formed with a structure that does not require a superstrate for support. In this manner, the lumiphoric material 16 forms a cover structure for the LED package 42. For example, the lumiphoric material 16 may embody a ceramic phosphor plate or a phosphor-in-glass structure that together with the light-altering material 20 provides protection from environmental exposure to underlying portions of the LED package 42. In this regard, the lumiphoric material 16 of FIG. 9 may comprise a pre-formed structure that is attached or otherwise mounted to the LED package 42. The lumiphoric material 16 may be mounted to the LED chip 12 with a transparent adhesive material, such as silicone, and peripheral edges of the lumiphoric material 16 may be retained within the light-altering material 20. In certain embodiments, the filter layer 30 as previously described may be arranged on one or more portions of a top face 16T of the lumiphoric material 16, thereby redirected unconverted light from the LED chip 12 that may reach the top face 16T back into the lumiphoric material 16. While the filter layer 30 is illustrated as continuous across the entire top face 16T in FIG. 9, the filter layer 30 may alternatively be arranged in different patterns, such as along a periphery of the top face 16T in a similar manner as illustrated for the filter layer 30 and the superstate 18 in FIG. 8. In still further embodiments, the filter layer 30 may be formed in one or more discontinuous patterns along the top face 16T to provide different mixing arrangements of unconverted and converted light that may escape the LED package 42. As illustrated, the reflective layer 26 as previously described may optionally be arranged on one or more sidewalls 16s of the lumiphoric material 16 to further tailor an emission pattern for the LED package 42.

Figure 10:
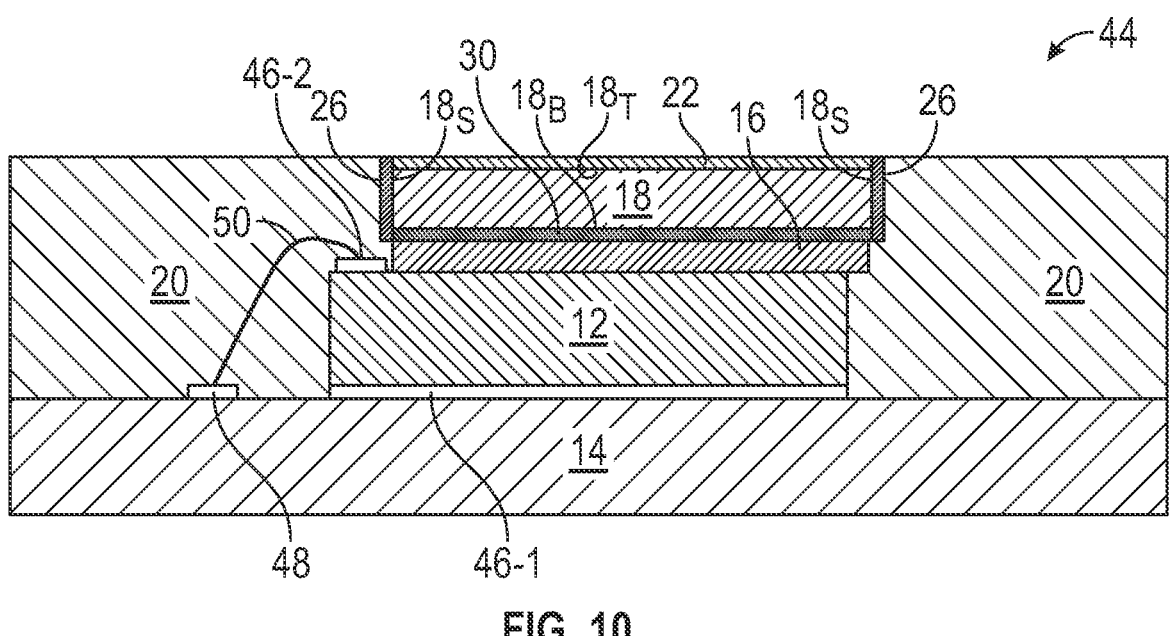
FIG. 10 is a cross-sectional view of an LED package that is similar to the LED package of FIG. 1 and includes an arrangement of a cover structure for accommodating a vertical contact structure for the LED chip according to principles of the present disclosure.

FIG. 10 is a cross-sectional view of an LED package 44 that is similar to the LED package 10 of FIG. 1 and includes an arrangement of the cover structure for accommodating a vertical contact structure for the LED chip 12 according to principles of the present disclosure. The cover structure may be formed by any combination of one or more of the lumiphoric material 16, the superstrate 18, the antireflective layer 22, the reflective layer 26, and the filter layer 30. In certain embodiments, any of the lumiphoric material 16, the superstrate 18, the antireflective layer 22, the reflective layer 26, and the filter layer 30 may be omitted or arranged similar to any of the other embodiments of the present disclosure (e.g., any of FIGS. 1 to 9). In FIG. 10, a portion of the cover structure described above is arranged with an overhang that extends past a lateral boundary or edge of the LED chip 12. This may be beneficial for ensuring suitable coverage of the LED chip 12 during mounting of the cover structure in the LED package 44, or in any of the LED packages of previous embodiments. In other embodiments, the edges of the cover structure may be vertically aligned with edges of the LED chip 12, or inset from edges of the LED chip 12. As illustrated, the LED chip 12 may include contacts 46-1, 46-2 that are on opposing faces or sides of the LED chip 12, such as a topside and a bottom side thereof. Depending on the structure of the LED chip 12, the contact 46-1 may be configured as either the anode or the cathode for the LED chip 12 while the contact 46-2 may be configured as the other of the anode or the cathode. As illustrated, the contact 46-2 may be arranged on a side (e.g., a topside) of the LED chip 12 that is opposite the submount 14. The contact 46-2 may be electrically connected to a trace 48, or other electrical connection, that is on the submount 14 by way of a wirebond 50. As illustrated, the wirebond 50 may extend through the light-altering material 20 and a portion of the light-altering material 20 may be arranged over the contact 46-2. In order to accommodate the electrical connections to the contact 46-2, the cover structure formed by the superstrate 18, the lumiphoric material 16, and any of the antireflective layer 22, the reflective layer 26, and the filter layer 30 may not be provided over the contact 46-2. In certain embodiments, the cover structure may be formed with one or more notches or cut-out portions that correspond with a shape of the contact 46-2.

Figures 11, 12:
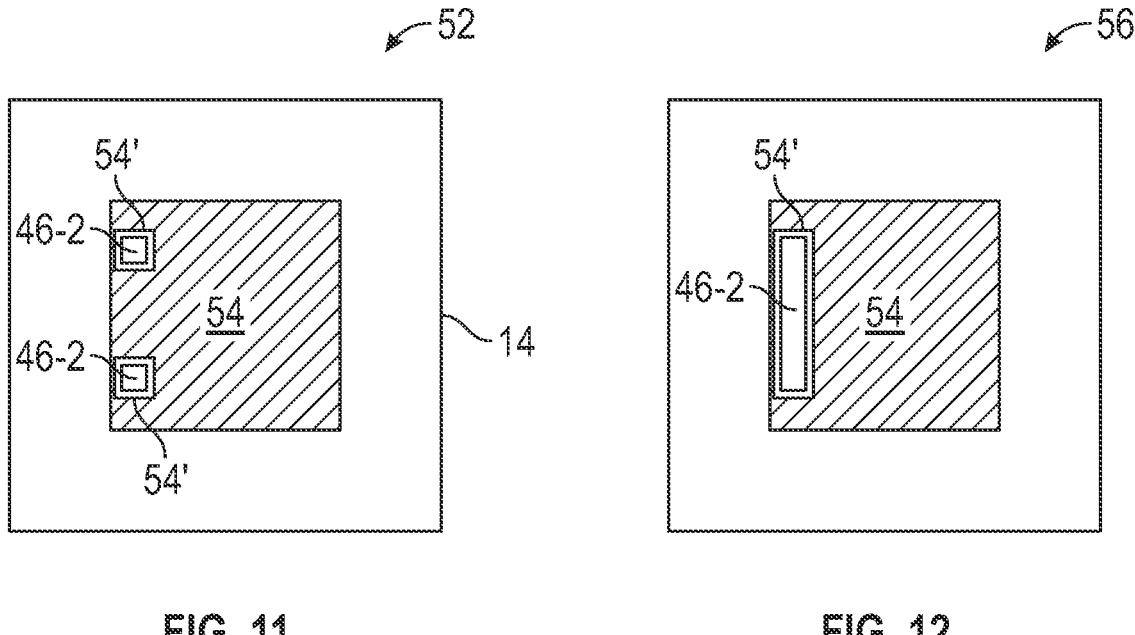
FIG. 11 is a top view of an exemplary LED package where a cover structure is arranged with multiple notches or cut-out portions that correspond with multiple contacts that are on a topside of the underlying LED chip.
FIG. 12 is a top view of an exemplary LED package where the cover structure is arranged with a single notch or cut-out portion that corresponds with a single contact that is on a topside of the underlying LED chip.

FIG. 11 is a top view of an exemplary LED package 52 where a cover structure 54 is arranged with multiple notches or cut-out portions 54' that correspond with multiple contacts 46-2 that are on a topside of the underlying LED chip. The cover structure 54 may embody any combination of one or more of the lumiphoric material 16, the superstrate 18, the antireflective layer 22, the reflective layer 26, and the filter layer 30 as previously described. FIG. 12 is a top view of an exemplary LED package 56 where the cover structure 54 is arranged with a single notch or cut-out portion 54' that corresponds with a single contact 46-2 that is on a topside of the underlying LED chip. In this regard, cover structures 54 of the present disclosure may be preformed with shapes that correspond with different patterns of topside contact structures for underlying LED chips.

Aspects of the present disclosure may include light-absorbing layers that are configured to absorb certain wavelengths of light while permitting other wavelengths to pass therethrough. Light-absorbing layers may include pigment materials of colors that absorb the intended wavelengths. In certain aspects, an LED package may include an LED chip configured to emit light of a first peak wavelength and a cover structure that includes a light-absorbing layer with a pigment of a color that absorbs the first peak wavelength. By way of example, the LED chip may be configured to emit blue light with a first peak wavelength in a range from 430 nm to 480 nm, and the light-absorbing layer may include a pigment that absorbs the first peak wavelength range. In this manner, the LED chip may emit blue light and the light-absorbing layer may reduce an amount of blue light that escapes the LED package while allowing other light outside of the first peak wavelength range to pass freely through the light-absorbing layer. Such an arrangement may be useful for embodiments that also include a lumiphoric material that converts a portion of the first peak wavelength to light of a second peak wavelength. Accordingly, the LED package may predominantly emit light of the second peak wavelength. Exemplary LED packages include so-called phosphor-converted single colors, such as phosphor-converted amber, among others. Cover structures for LED packages may include one or more combinations of light-absorbing layers, antireflective layers, and reflective layers for providing improved emission characteristics for the LED package.

Figures 13, 14:
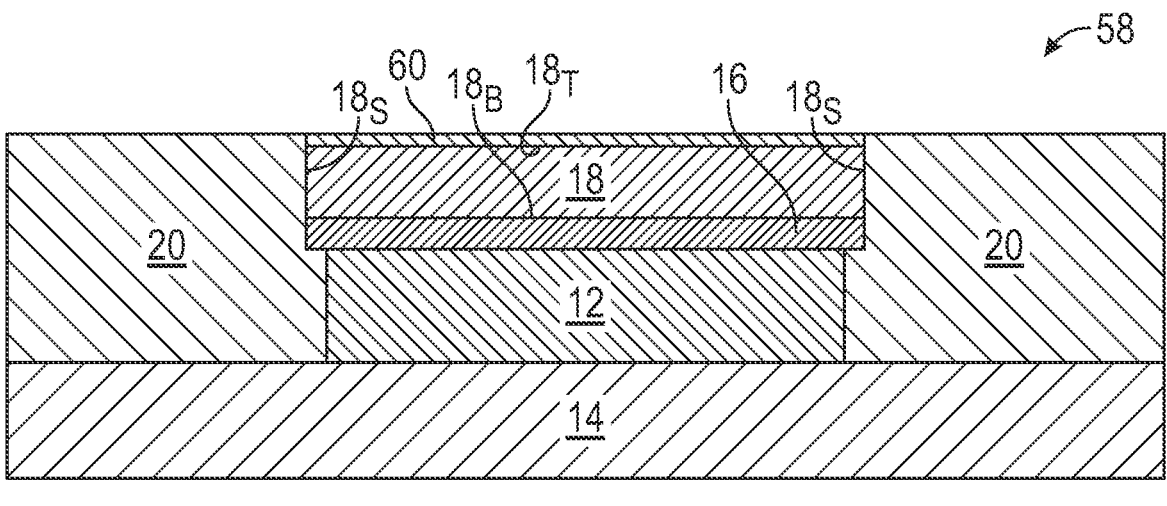
FIG. 13 is a cross-sectional view of an LED package that is similar to the LED package of FIG. 1 except the LED package includes a light-absorbing layer according to aspects of the present disclosure.
FIG. 14 is a cross-sectional view of an LED package that is similar to the LED package of FIG. 13 for embodiments where the light-absorbing layer is further arranged along sidewalls of the superstrate.

FIG. 13 is a cross-sectional view of an LED package 58 that is similar to the LED package 10 of FIG. 1 except the LED package 58 includes a light-absorbing layer 60 according to aspects of the present disclosure. As illustrated, the LED chip 12 may be mounted on the submount 14 and the lumiphoric material 16 is arranged to receive light of a first peak wavelength from the LED chip 12 and convert at least a portion of the first peak wavelength to light of a second peak wavelength. The light-absorbing layer 60 may be arranged such that the lumiphoric material 16 is between the light-absorbing layer 60 and the LED chip 12. In this manner, light of the first peak wavelength and light of the second peak wavelength may reach the light-absorbing layer 60. The light-absorbing layer 60 may be configured with a color that effectively absorbs the light of the first-peak wavelength while being light-transparent to light of the second peak wavelength. In certain embodiments, the lumiphoric material 16 and the light-absorbing layer 60 may be arranged on opposing sides of the superstrate 18 to form a cover structure. Since the superstrate 18 is light-transparent to the both the first peak wavelength and the second peak wavelength, light may freely propagate laterally within the superstrate 18 before interacting with the light-absorbing layer 60. In this regard, back scattered light of the first peak wavelength may have increased opportunities to propagate back to the lumiphoric material 16 for wavelength conversion instead of directly entering the light-absorbing layer 60. As illustrated, the light-altering material 20 may be arranged along sidewalls of the LED chip 12 and side walls 18s of the superstrate 18 of the cover structure to redirect light through the light-absorbing layer 60. In this manner, the light-absorbing layer 60 may form an external emission surface for the LED package 58. In certain embodiments, the light-altering material 20 may partially cover sidewalls of the light-absorbing layer 60. In still further embodiments and based on a desired emission pattern for the LED package 58, the light-altering material 20 may entirely cover sidewalls of the light-absorbing layer 60.

FIG. 14 is a cross-sectional view of an LED package 62 that is similar to the LED package 58 of FIG. 13 for embodiments where the light-absorbing layer 60 is further arranged along sidewalls 18s of the superstrate 18. Accordingly, portions of the light-absorbing layer 60 are arranged between the superstrate 18 and the light-altering material 20. In certain embodiments, arranging the light-absorbing layer 60 along the sidewalls 18s of the superstrate 18 may improve color-over-angle uniformity for emissions exiting the LED package 62. For example, in some instances, light of the first peak wavelength from the LED chip 12 may escape the LED package 62 along sidewalls 18s and near top corners of the superstrate 18 and provide undesired edge emissions. Such light may have relatively short distances to travel through the light-altering material 20, thereby increasing the likelihood of escaping the LED package 58 and bypassing the light-absorbing layer 60. By providing the light-absorbing layer 60 along the sidewalls 18s, such light may effectively be absorbed so that the light of the second peak wavelength from the lumiphoric material 16 may be predominantly emitted by the LED package 62.

Figure 15:
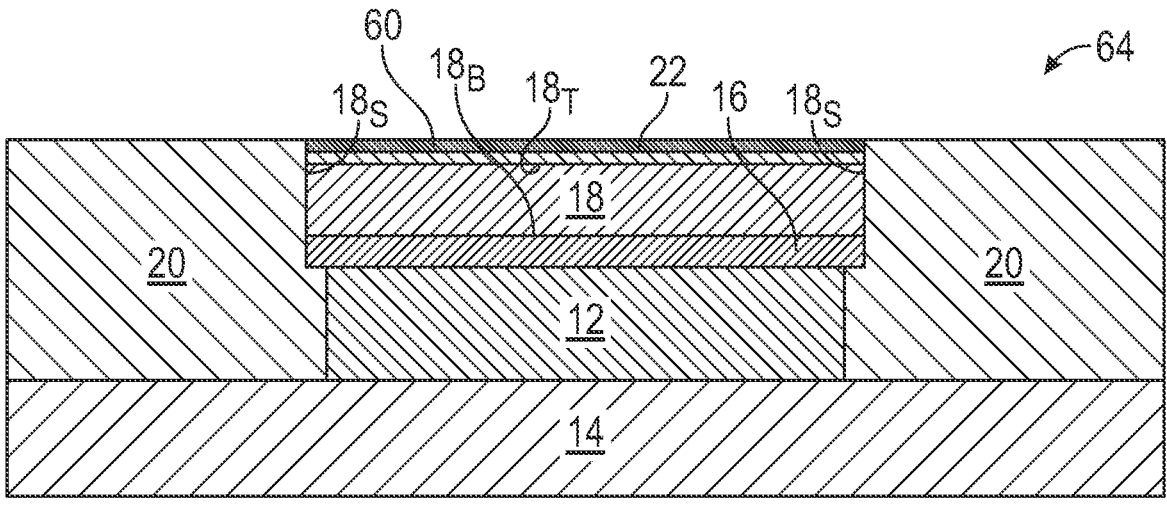
FIG. 15 is a cross-sectional view of an LED package that is similar to the LED package of FIG. 13 for embodiments that further include at least one antireflective layer.

FIG. 15 is a cross-sectional view of an LED package 64 that is similar to the LED package 58 of FIG. 13 for embodiments that further include at least one antireflective layer 22 as described above for FIG. 1. In FIG. 15, the antireflective layer 22 is arranged as part of the cover structure such that the light-absorbing layer 60 is between the antireflective layer 22 and the superstrate 18. In this arrangement, the antireflective layer 22 forms an external emission surface for the LED package 64. Accordingly, light that passes through the light-absorbing layer 60, e.g., light from the lumiphoric material 16, may benefit from reduced internal reflections at the interface with the antireflective layer 22. In certain embodiments for the LED package 64, the light-absorbing layer 60 may further extend along the sidewalls 18s of the superstrate 18 as illustrated in FIG. 14.

Figure 16:
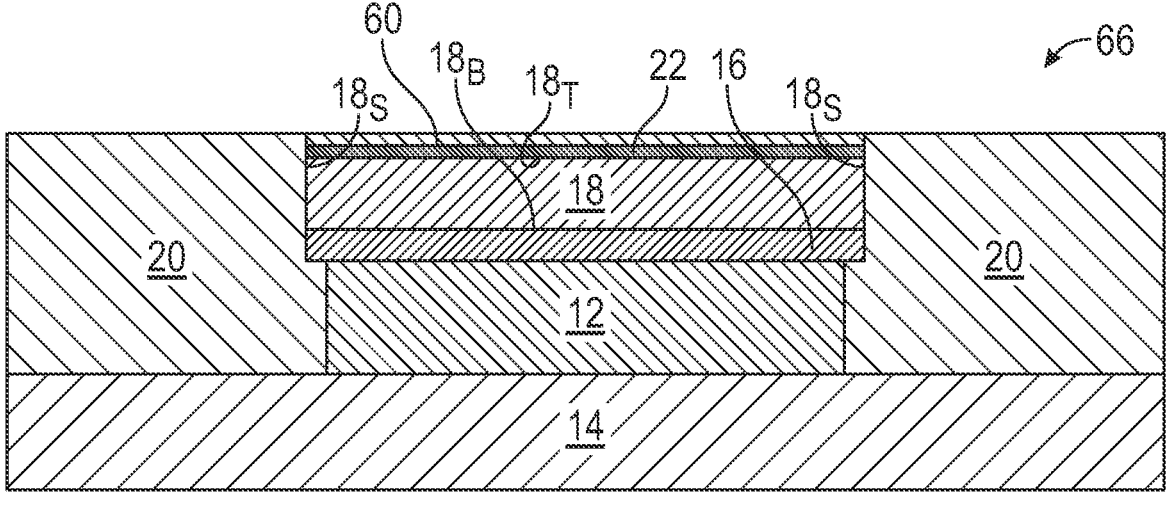
FIG. 16 is a cross-sectional view of an LED package that is similar to the LED package of FIG. 15 with an alternative arrangement of the antireflective layer.

FIG. 16 is a cross-sectional view of an LED package 66 that is similar to the LED package 64 of FIG. 15 with an alternative arrangement of the antireflective layer 22. In FIG. 16, the antireflective layer 22 is arranged between the light-absorbing layer 60 and the LED chip 12. In certain embodiments, the antireflective layer 22 is arranged between the light-absorbing layer 60 and the superstrate 18. Accordingly, light that is propagating within the superstrate 18, e.g., light from both the LED chip 12 and the lumiphoric material 16, may benefit from reduced internal reflections at the interface with the antireflective layer 22, thereby increasing amounts of light that exit the superstrate 18 into the light-absorbing layer 60. In certain embodiments for the LED package 66, the light-absorbing layer 60 may further extend along the sidewalls 18s of the superstrate 18 as illustrated in FIG. 14.

Figure 17:
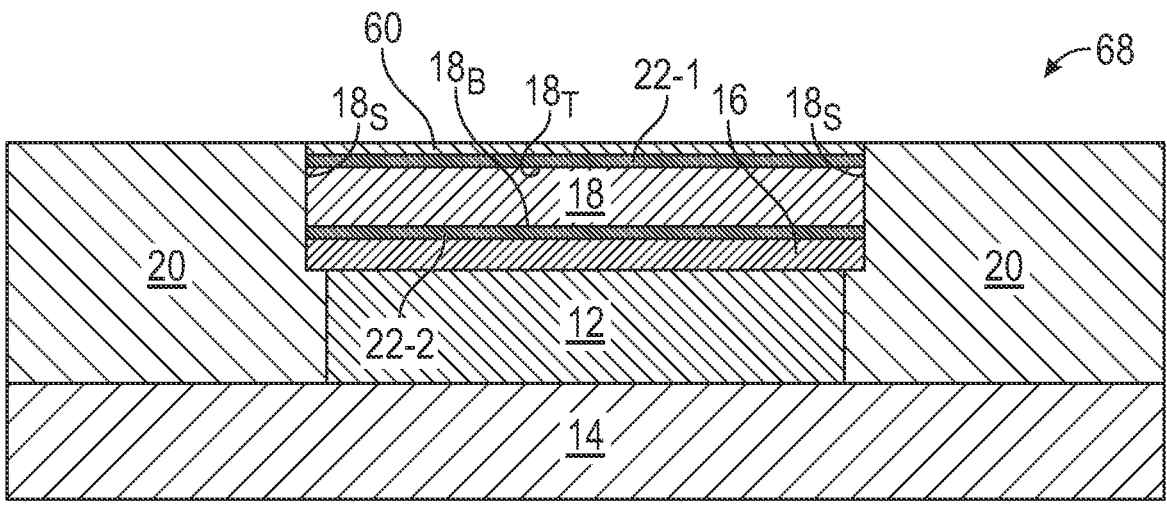
FIG. 17 is a cross-sectional view of an LED package that is similar to the LED package of FIG. 15 and includes multiple antireflective layers.

FIG. 17 is a cross-sectional view of an LED package 68 that is similar to the LED package 64 of FIG. 15 and includes multiple antireflective layers 22-1, 22-2. As illustrated, a first antireflective layer 22-1 may be arranged in a similar manner as illustrated in FIG. 16, and a second antireflective layer 22-2 may be arranged between the superstrate 18 and the lumiphoric material 16. In this arrangement, the second antireflective layer 22-2 may reduce internal reflections between the lumiphoric material 16 and the superstrate 18. By arranging the first and second antireflective layers 22-1, 22-2 on opposing faces of the superstrate 18, light may pass through each interface with reduced internal reflections. While the first antireflective layer 22-1 is illustrated the same as in FIG. 16, the first antireflective layer 22-1 could alternatively be arranged as illustrated in FIG. 15.

Figure 18:
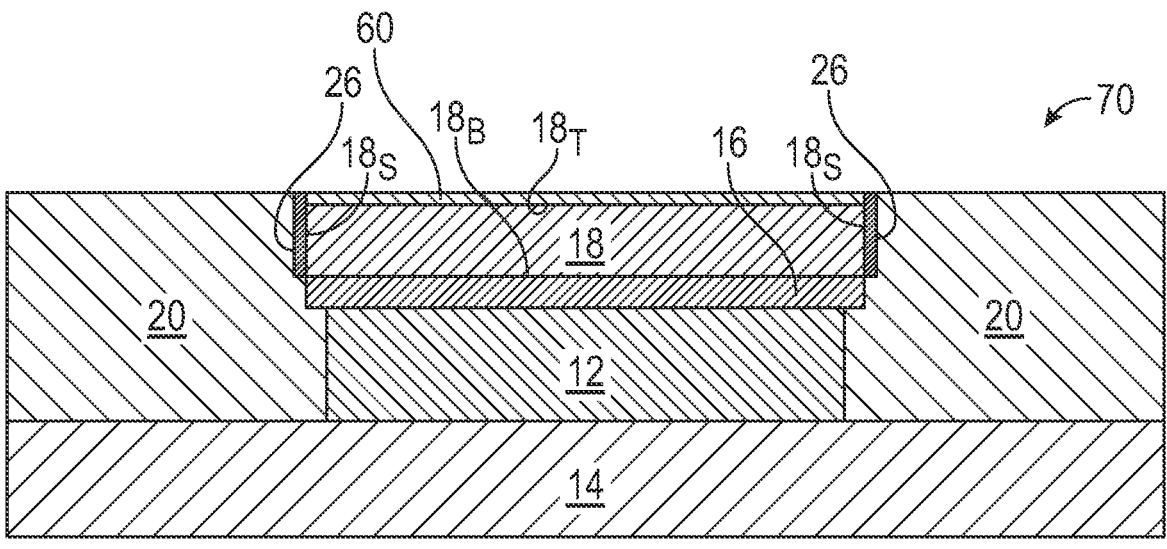
FIG. 18 is a cross-sectional view of an LED package that is similar to the LED package of FIG. 13 for embodiments where the cover structure further includes reflective structures.

FIG. 18 is a cross-sectional view of an LED package 70 that is similar to the LED package 58 of FIG. 13 for embodiments where the cover structure further includes reflective structures as illustrated for FIG. 2. As illustrated, the reflective layer 26 may be arranged on one or more sidewalls 18s of the superstrate 18. In this manner, light from one or more of the LED chip 12 and the lumiphoric material 16 that traverses laterally within the superstrate 18 may be reflected at the sidewalls 18s, thereby increasing the likelihood of such light being provided in a desired emission direction toward the light-absorbing layer 60. In certain embodiments, the reflective layer 26 may cover sidewalls of the light-absorbing layer 60 and the superstrate 18 so that light of various angles that reaches the sidewalls 18s may be redirected without inadvertently bypassing the light-absorbing layer 60 near edges of the superstrate 18. Without the reflective layer 26, some angled light that bypasses the light-absorbing layer 60 would only have small distances to travel through the light-altering material 20 to escape the LED package 70. In certain embodiments, the reflective layer 26 is between the sidewalls 18s of the superstrate 18 and the light-altering material 20.

While FIGS. 13 to 18 are provided in the context of cover structures that include superstrates, the principles disclosed are equally applicable to other cover structures, such as illustrated for FIG. 9. As indicated below, FIGS. 19 to 24 illustrate embodiments that are similar to respective ones of FIGS. 13 to 18 except the cover structure includes a ceramic phosphor plate or a phosphor-in-glass structure. In such embodiments, the lumiphoric material 16 may provide mechanical stability that obviates the need for a separate superstrate.

Figures 19, 20:
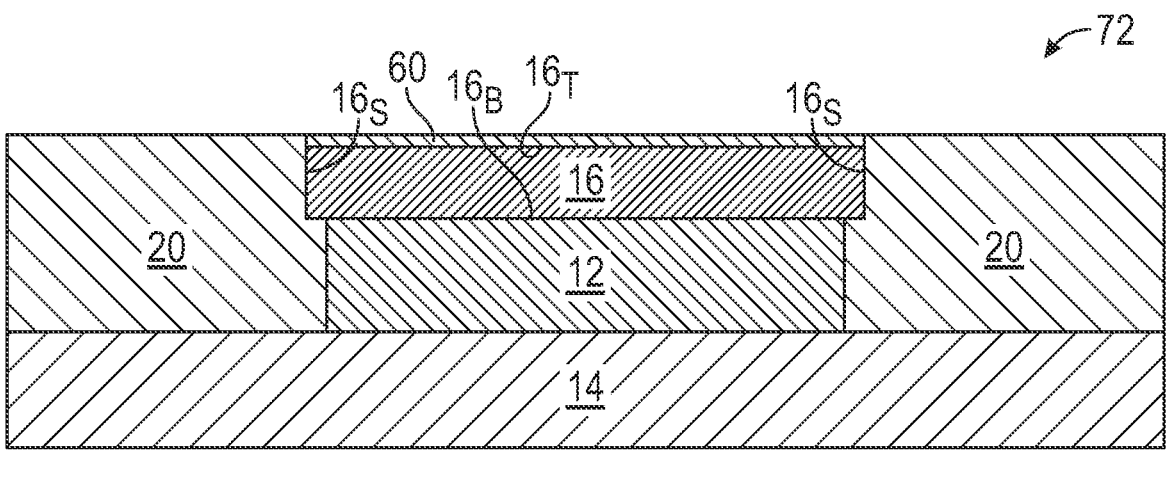
FIG. 19 is a cross-sectional view of an LED package that is similar to the LED package of FIG. 13 except the lumiphoric material embodies a ceramic phosphor plate or a phosphor-in-glass structure.
FIG. 20 is a cross-sectional view of an LED package that is similar to the LED package of FIG. 19 for embodiments where the light-absorbing layer is further arranged along sidewalls of the lumiphoric material.

FIG. 19 is a cross-sectional view of an LED package 72 that is similar to the LED package 58 of FIG. 13 except the lumiphoric material 16 embodies a ceramic phosphor plate or a phosphor-in-glass structure. Accordingly, a majority of the cover structure is occupied by the lumiphoric material 16 and the light-absorbing layer 60 may be provided on, or directly on, the top face 16T of the lumiphoric material 16.

FIG. 20 is a cross-sectional view of an LED package 74 that is similar to the LED package 72 of FIG. 19 for embodiments where the light-absorbing layer 60 is further arranged along sidewalls 16s of the lumiphoric material 16. In a similar manner as described above for FIG. 14, such an arrangement promotes absorption of certain light along sidewalls of the lumiphoric material 16 to improve color-over-angle uniformity for emissions from the LED package 74.

Figures 21, 22:
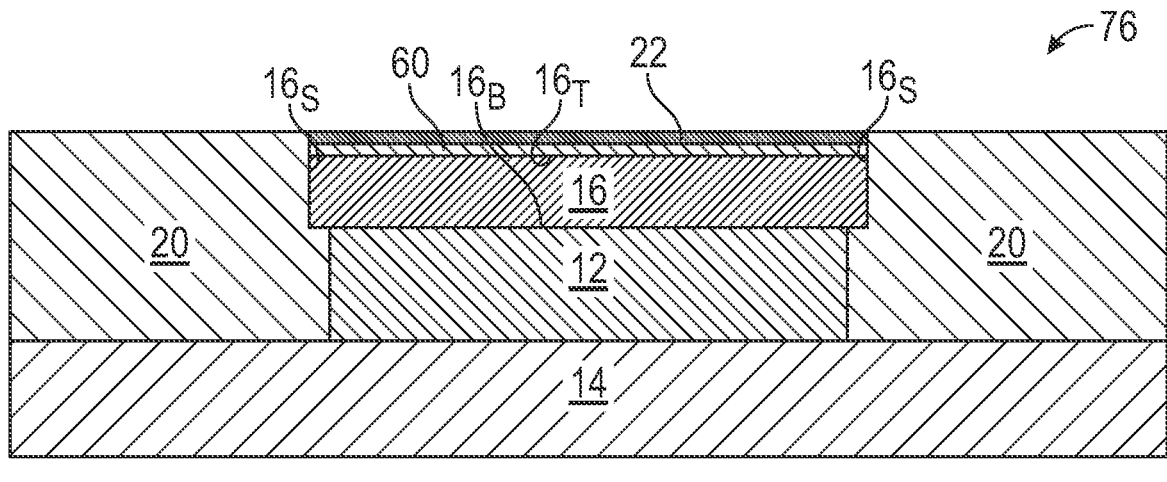
FIG. 21 is a cross-sectional view of an LED package that is similar to LED package of FIG. 19 and further includes at least one antireflective layer.
FIG. 22 is a cross-sectional view of an LED package that is similar to the LED package of FIG. 21 with an alternative arrangement of the antireflective layer.

FIG. 21 is a cross-sectional view of an LED package 76 that is similar to the LED package 72 of FIG. 19 and further includes at least one antireflective layer 22 in a similar manner to FIG. 15. In FIG. 21, the light-absorbing layer 60 is arranged between the antireflective layer 22 and the lumiphoric material 16 such that the antireflective layer 22 forms an external emission surface of the LED package 76. In this manner, the antireflective layer 22 may reduce amounts of light that may be backscattered by internal reflections at the external emission surface.

FIG. 22 is a cross-sectional view of an LED package 78 that is similar to the LED package 76 of FIG. 21 with an alternative arrangement of the antireflective layer 22. In a similar manner as FIG. 15, the antireflective layer 22 in FIG. 22 is arranged between the light-absorbing layer 60 and the lumiphoric material 16, thereby reducing internal reflections for light traveling from the lumiphoric material 16 to the light-absorbing layer 60.

Figure 23:
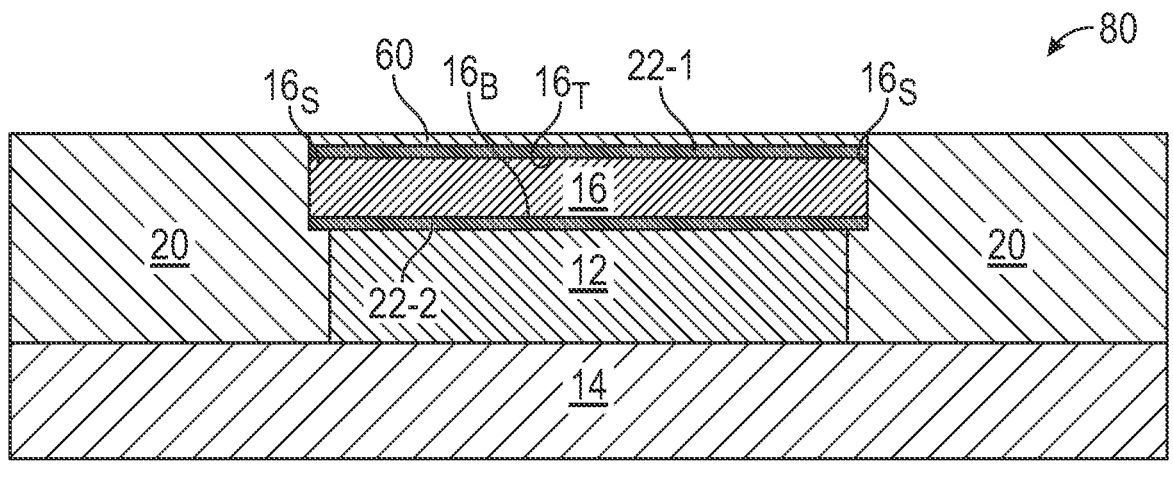
FIG. 23 is a cross-sectional view of an LED package that is similar to the LED package of FIG. 21 and includes multiple antireflective layers.

FIG. 23 is a cross-sectional view of an LED package 80 that is similar to the LED package 76 of FIG. 21 and includes multiple antireflective layers 22-1, 22-2 in a manner similar to FIG. 16. In FIG. 23, the antireflective layers 22-1, 22-2 are located on opposing faces, e.g., the top face 16T and the bottom face 16B, of the lumiphoric material 16. In such an arrangement, internal reflections between the LED chip 12 and the lumiphoric material 16 and internal reflections between the lumiphoric material 16 and the light-absorbing layer 60 may be reduced.

Figure 24:
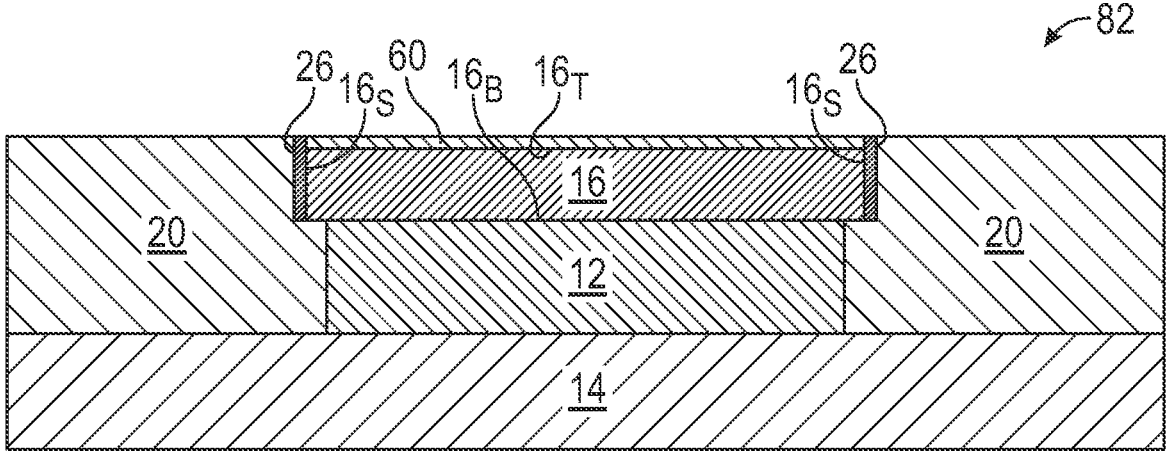
FIG. 24 is a cross-sectional view of an LED package that is similar to the LED package of FIG. 19 and further includes reflective structures.

FIG. 24 is a cross-sectional view of an LED package 82 that is similar to the LED package 72 of FIG. 19 and further includes reflective structures as illustrated for FIG. 18. As illustrated, the reflective layer 26 may be arranged on one or more sidewalls 16s of the lumiphoric material 16 to redirect laterally propagating light within the lumiphoric material 16.

Additionally, the reflective layer 26 may be arranged to cover at least a portion of or the entire light-absorbing layer 60 to reduce instances of light escaping the LED package 82 by bypassing edges of the light-absorbing layer 60 and traveling relatively short distances through the light-altering material 20.

Aspects of the present disclosure are provided that may include any of the previously described arrangements of the one or more of antireflective layers or coatings, the filter layers or coatings, and the reflective layers or coatings individually or in various combinations on cover structures to provide improved light output and/or light extraction for LED packages. Additional aspects include the previously described arrangements of light-absorbing layers individually or in various combinations with antireflective layers. Such embodiments may be well suited to provide advantages for LED packages in a variety of applications, including but not limited to applications that require high power, high light intensity, and high contrast, for example LED packages for use in automotive applications. Such LED packages may provide improved reliability, increased light output, improved uniformity of light emissions, and reduced usage of lumiphoric materials.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
   a submount;
   at least one LED chip on the submount, the at least one LED chip being configured to emit light having a first peak wavelength;
   a cover structure on the at least one LED chip, the cover structure comprising a superstrate and a light-absorbing layer with a pigment material that absorbs the first peak wavelength; and
   a lumiphoric material on the at least one LED chip, the superstrate being arranged between the lumiphoric material and the light-absorbing layer and the light-absorbing layer being further arranged on at least one sidewall of the cover structure without extending to sidewalls of the lumiphoric material.

2. The LED package of claim 1, wherein the lumiphoric material is arranged between the light-absorbing layer and the at least one LED chip, and the lumiphoric material is configured to convert a portion of the light of the first peak wavelength to light of a second peak wavelength.

3. The LED package of claim 2, wherein the light-absorbing layer is light-transparent to the light of the second peak wavelength.

4. The LED package of claim 3, wherein the first peak wavelength is in a range from 430 nanometers (nm) to 480 nm and the second peak wavelength is in a range from greater than 500 nm to 650 nm.

5. The LED package of claim 1, wherein the light-absorbing layer is further arranged on at least one sidewall of the superstrate.

6. The LED package of claim 1, further comprising a light-altering material on the submount and arranged around a perimeter of the at least one LED chip, wherein sidewalls of the cover structure are covered by the light-altering material.

7. The LED package of claim 6, wherein sidewalls of the light-absorbing layer are at least partially covered by the light-altering material.

8. A light-emitting diode (LED) package comprising:
a submount;
at least one LED chip on the submount, the at least one LED chip being configured to emit light having a first peak wavelength;
a lumiphoric material that is arranged to convert a portion of the light of the first peak wavelength to light of a second peak wavelength;
a light-absorbing layer with a pigment material that absorbs the first peak wavelength, the lumiphoric material being arranged between the light-absorbing layer and the at least one LED chip; and
a superstrate between the lumiphoric material and the light-absorbing layer, the superstrate being light-transparent to light of the first peak wavelength and light of the second peak wavelength, wherein the light-absorbing layer is on at least one sidewall of the superstrate without extending to sidewalls of the lumiphoric material.

9. The LED package of claim 8, wherein the light-absorbing layer is light-transparent to the light of the second peak wavelength.

10. The LED package of claim 8, further comprising
a light-altering material on the submount and around a perimeter of the at least one LED chip.

\*   \*   \*   \*   \*